United States Patent
Hartig

(10) Patent No.: US 7,157,123 B2
(45) Date of Patent: Jan. 2, 2007

(54) PLASMA-ENHANCED FILM DEPOSITION

(75) Inventor: Klaus Hartig, Avcoa, WI (US)

(73) Assignee: Cardinal CG Company, Eden Prairie, MN (US)

( * ) Notice: Subject to any disclaimer, the term of this patent is extended or adjusted under 35 U.S.C. 154(b) by 212 days.

(21) Appl. No.: 10/739,887

(22) Filed: Dec. 18, 2003

(65) Prior Publication Data

US 2004/0163945 A1 Aug. 26, 2004

(51) Int. Cl.
*H05H 1/04* (2006.01)
(52) U.S. Cl. .................. 427/571; 438/694; 438/695
(58) Field of Classification Search ............. 427/569, 427/571; 438/694, 695
See application file for complete search history.

(56) References Cited

U.S. PATENT DOCUMENTS

| | | | |
|---|---|---|---|
| 4,849,087 A | 7/1989 | Meyer | |
| 4,863,756 A | 9/1989 | Hartig et al. | |
| 4,895,631 A | 1/1990 | Wirz et al. | |
| 5,045,166 A | 9/1991 | Bobbio | |
| 5,047,131 A | 9/1991 | Wolfe et al. | |
| 5,057,244 A * | 10/1991 | Nitta et al. | 252/501.1 |
| 5,082,685 A | 1/1992 | Morooka | |
| 5,096,562 A | 3/1992 | Boozenny et al. | |
| 5,099,790 A * | 3/1992 | Kawakami | 118/723 MR |
| 5,262,032 A | 11/1993 | Hartig et al. | |
| 5,384,021 A | 1/1995 | Thwaites | |
| 5,433,786 A * | 7/1995 | Hu et al. | 118/723 E |
| 5,437,725 A | 8/1995 | Schuster et al. | |
| 5,512,102 A | 4/1996 | Yamazaki | |
| 5,525,159 A | 6/1996 | Hama et al. | |
| 5,531,834 A | 7/1996 | Ishizuka et al. | |
| 5,558,750 A | 9/1996 | Szczyrbowski | |
| 5,683,558 A | 11/1997 | Sieck et al. | |
| 5,891,349 A * | 4/1999 | Tobe et al. | 216/68 |
| 6,055,929 A | 5/2000 | Hu | |
| 6,110,540 A * | 8/2000 | Countrywood et al. | 427/569 |
| 6,171,454 B1 | 1/2001 | Weber et al. | |
| 6,171,659 B1 | 1/2001 | Vanden Brande et al. | |
| 6,435,196 B1 * | 8/2002 | Satoh et al. | 134/1.1 |
| 6,461,485 B1 * | 10/2002 | Mizouchi et al. | 204/192.15 |
| 6,462,482 B1 * | 10/2002 | Wickramanayaka et al. | 315/111.21 |
| 6,628,084 B1 * | 9/2003 | Winther-Jensen et al. | 315/111.21 |
| 6,727,654 B1 * | 4/2004 | Ogawa et al. | 315/111.01 |
| 6,776,847 B1 * | 8/2004 | Yamazaki et al. | 118/724 |
| 6,812,648 B1 * | 11/2004 | Luten et al. | 315/111.81 |
| 2002/0092766 A1 | 7/2002 | Lampkin | |
| 2003/0178299 A1* | 9/2003 | Shin et al. | 204/298.2 |

FOREIGN PATENT DOCUMENTS

| | | |
|---|---|---|
| DE | 0 228 394 B1 | 4/1991 |
| EP | 0 535 568 | 4/1993 |
| WO | WO 86/07391 | 12/1986 |

* cited by examiner

*Primary Examiner*—Bret Chen
(74) *Attorney, Agent, or Firm*—Fredrikson & Byron, P.A.

(57) ABSTRACT

Methods and equipment for depositing films. In certain embodiments, there is provided a deposition chamber having a substrate-coating region and an electrode-cleaning region. In these embodiments, an electrode is positioned in the deposition chamber and has an interior cavity in which first and second magnet systems are disposed. In certain embodiments, there is provided a method for depositing films onto substrates using a deposition chamber of the described nature. The invention also provides electrode assemblies for film-deposition equipment. In certain embodiments, the electrode assembly comprises a rotatable electrode (optionally having an outer coating of carbon or the like) having an interior cavity, with stationary first and second generally-opposed magnet systems being disposed in this interior cavity.

9 Claims, 8 Drawing Sheets

Figure 2

PLASMA-ENHANCED FILM DEPOSITION

FIELD OF THE INVENTION

The present invention relates to deposition of films on glass and other substrates. More particularly, this invention relates to plasma-enhanced deposition of films on glass and other substrates.

BACKGROUND OF THE INVENTION

In the coated glass industry, it is often desirable to apply one or more thin layers of coating material to glass to impart desired properties in the resulting coated glass. For example, infrared-reflective coatings (e.g., low-emissivity coatings) are commonly applied to glass sheets. Coatings of many different types are used to impart in coated substrates desired properties, such as particular levels of transmissivity, reflectivity, absorptivity, emissivity, shading performance, color, durability, hydrophilicity, hydrophobicity, and photoactivity.

A variety of coatings are applied to glass for use in architectural and automotive applications. These coatings are commonly applied using "in-line" vacuum coaters with magnetron sputtering sources. For example, cylindrical magnetrons are used in many sputter deposition methods. In these methods, a substrate is positioned in a vacuum chamber containing at least one cylindrical target. Cylindrical targets are well known in the present art and commonly take the form idealized in FIGS. 4A and 4B. The cylindrical target 180 comprises a backing tube 182 carrying a thick outer layer of sputterable target material 185. The backing tube 182 is typically a rigid, elongated tube of electrically-conductive material (e.g., metal), which may be coated with a relatively thin bonding layer 184. A stationary magnet assembly 170 is typically positioned within the interior cavity 188 of the rotatable target 180. This magnet assembly 170 confines plasma in the chamber to a region adjacent the target 180. The target 180 is commonly mounted in the chamber to a pair of opposed end blocks (cantilever end block systems are also known), with each end block being adapted to hold one of the ends 189 of the backing tube 182.

During sputtering, an electrical field is typically created between a cathode and an anode in the sputtering chamber. Commonly, the sputtering target functions as the cathode and at least one separate anode is provided in the chamber at a location spaced away from the target. For example, a separate bar or another electrically-conductive member may function as the anode. Gas is delivered to the chamber to facilitate producing a plasma (e.g., a glow discharge). Electrons accelerate in the electrical field, gaining enough energy to ionize the gas atoms and create the plasma. Positively-charged particles (e.g., ions) in the plasma are attracted to the cathodic target, bombarding it and causing particles (e.g., atoms) of the target material to be ejected from the target. As sputtering continues, more and more particles are emitted from the target, causing erosion of the layer of target material 185. Eventually, the useful target material is depleted and the target must be replaced.

Thus, the continuity of the sputtering process is limited by the amount of useful target material on the target. Generally, sputtering is only continued until the useful target material is consumed, at which point each consumed target is no longer used. Thus, the sputtering process must be shut down periodically and the consumed targets replaced. This prevents manufacturers from operating their astronomically expensive sputtering lines (e.g., costing many millions of dollars) on a continuous, uninterrupted basis.

The coatings (e.g., low-emissivity coatings) used for architectural and automotive applications commonly comprise metal film and transparent dielectric film. When depositing metal film, a metal target is typically sputtered in the presence of inert gas, such as argon. When depositing dielectric film, a metal target is commonly sputtered in the presence of a reactive gas (e.g., oxygen or nitrogen). Thus, a reaction product (e.g., a metal oxide or metal nitride) of the metal target material and the reactive gas is deposited on the substrate. In some cases, dielectric films are alternatively deposited by sputtering ceramic targets in substantially inert atmospheres (optionally containing some reactive gas).

Thus, in depositing low-emissivity coatings and many other types of coatings, each substrate is commonly passed through a series of connected sputtering chambers (i.e., a sputtering line), wherein some of the chambers are adapted for depositing metal films and others are adapted for depositing dielectric films. Unfortunately, the continuity of the sputtering process in both types of chambers is limited by the need to replace consumed targets. The continuity of sputtering in chambers adapted for depositing dielectric films is even more severely limited, as will now be discussed.

During sputtering, an undesirable contamination layer builds up on the walls and other interior surfaces of the sputtering chamber. Ejected particles of target material are deposited on the substrate and, unfortunately, on other exposed surfaces within the sputtering chamber (walls, anodes, shields, rollers, etc.). Over time, a layer of sputtered material (i.e., a "contamination layer" or an "overcoat") builds up on the interior surfaces of the chamber. This is particularly problematic in chambers where dielectric films are deposited.

The contamination layer grows increasingly thick as sputtering is continued. As the thickness of this layer increases, its internal stress builds up until the point is reached where flakes begin to spall from the contamination layer. When this occurs, some of the spalling flakes can fall upon a freshly-deposited coating on the substrate, leaving inclusions or pinholes in the coating. This can be a problem in chambers where dielectric films are deposited, because dielectric films tend not to adhere to the interior chamber surfaces as well as metal films. This problem is exacerbated by the fact that a dielectric contamination layer is electrically nonconductive and can cause arcing, which can cause larger chunks to fall from the contamination layer onto the substrate.

Growth of an electrically nonconductive contamination layer on the anode(s) in a sputtering chamber can cause particular problems. Transparent dielectric films are commonly insulators, semiconductors, or other electrically non-conductive materials (e.g., $Si_3N_4$, $SiO_2$, $TiO_2$, ZnO, $SnO_2$, and $Al_2O_3$). The accumulation of such materials on an anode in a sputtering chamber initiates a progressive slowing of the sputtering process, which can ultimately result in a shutdown of the process. This phenomenon is commonly referred to as the "vanishing" or "poisoned" anode problem. A nonconductive contamination layer on the anode inhibits and eventually prevents charge carriers from flowing between the anode to the cathode. This has the effect of first reducing and eventually stopping the sputtering process. This also results in the conductive area of the anode changing in size during sputtering, thus rendering the sputtering process more difficult to control and potentially leaving non-uniformities among deposited coatings.

Growth of a dielectric contamination layer can complicate the sputtering process in further respects. For example, the charged plasma can be repulsed from the contamination layer due to like polarity of plasma particles and areas of contamination. As this repulsion increases, the distribution of the plasma may change as it "searches" for a conductive outlet. Moreover, as the conductive areas in the chamber become randomly distributed, the uniformity of the plasma discharge can deteriorate, thereby slowing the sputtering process. This non-uniformity of the plasma discharge can complicate process control and reduce the quality and uniformity of deposited films.

Growth of a contamination layer on the gas distribution system in a sputtering chamber can also cause particular problems. For example, when enough contamination builds up on gas delivery ports (e.g., so as to prevent gas from being delivered freely into the chamber), the sputtering process can be slowed due to insufficient plasma generation. In particular, when enough contamination builds up on the gas delivery ports in reactive sputtering, there may be insufficient reaction between the sputtered material and the reactive gas. Thus, the deposited films may be more metallic than is desired. This can make it difficult to deposit films meeting desired product specifications. It can also complicate controlling the process stability and sputtering rate.

To combat the foregoing problems, manufacturers periodically shut down their coaters and clean the contamination layer off the interior surfaces of each chamber. This involves venting each chamber, carefully cleaning it (e.g., sandblasting, scraping, or otherwise manually removing the contamination layer), and then re-evacuating the chamber. Consumed targets are typically replaced while the chambers are open for cleaning. The chamber cleaning process takes a great deal of time and effort. It is estimated that manufacturers lose as much as 40% of their potential production time to chamber clean-ups and target change-outs. This downtime is extremely expensive given the staggering cost of industrial sputtering equipment. Thus, it can be appreciated that a continuous coating process would provide an outstanding boost in productivity.

The foregoing problems can be aggravated when manufacturers try to stretch the productive operating period of a coater. At the end of the productive period for a given chamber, the plasma discharge searches for uncontaminated areas in the chamber. To keep the plasma discharge active, manufacturers sometimes deliver extra gas into the chamber. This can be risky for manufacturers, as the extra gas can create a nucleation curtain or a clustering of sputtered material. As a result, electrical current can be directed to flow through the nucleation curtain into the gas distribution system seeking a path back to the power supply, thereby causing arcing that can melt the gas pipe, etc. In addition to necessitating the installation of new gas pipes, this can have adverse effects on the sputtering process.

Solutions have been proposed to some of the foregoing problems. One proposed solution is disclosed in U.S. Pat. No. 4,863,756, issued to Hartig et al., the entire contents of which are incorporated herein by reference. This Hartig patent describes methods and equipment for applying coating to a moving substrate. In this patent, gas is delivered to a deposition chamber and is converted to a plasma. One upwardly-oriented magnet assembly is used to create a magnetic trap that confines the plasma to a localized area above the moving substrate. Immediately above the magnet assembly is a plate-shaped electrode connected to a voltage source. The voltage source is either a direct-current source or a high-frequency source with a frequency of approximately 13.56 MHz. Two reels guide the substrate in a horizontal path of travel directly above the electrode. Above the path of substrate travel is a gas-delivery system that provides reaction gas. In operation, the substrate is conveyed over the electrode, the electrode converts the gas into plasma, the system of magnets holds the plasma adjacent the substrate, and the plasma creates a chemical reaction and/or decomposition by which coating is deposited on the substrate. Since the plasma is trapped adjacent the substrate, the conversion of reaction gas to coating occurs only in the immediate vicinity of the magnets (e.g., directly over the substrate). Thus, coating is deposited over the substrate, but not over interior chamber surfaces remote from the magnetic trap.

In another embodiment, Hartig discloses a rotatable guide roller that doubles as an electrode. In the interior of this guide roller, there is one stationary, upwardly-oriented magnet assembly that is used to create the magnetic trap. During operation, a continuous flexible substrate is passed over the guide roller as it is rotated. In this embodiment, any unwanted coating that accumulates on the electrode is spread over its large cylindrical surface.

This solution is well suited for coating substrates in reel-to-reel applications (e.g., thin metal film or thin insulating film supplied from a reel, coated, and collected on a wind-up reel). In such applications, the disclosed solution is useful for avoiding production stoppages for chamber cleaning. This solution also obviates the need for targets as source material. Thus, there are no targets or target change-outs, only continuous conversion of gas into solid coatings, and only on areas of the substrate within the magnetic trap. Unfortunately, this solution has significant limitations.

For example, this solution is effectively limited to coating continuous film-like substrates in reel-to-reel applications. In the case of glass, coating is commonly performed upon spaced-apart sheets, wherein gaps are left between adjacent sheets. These gaps may account for as much as 30% of the available load area on industrial sputtering lines (e.g., load factors of 70% are not uncommon). With the equipment of this Hartig patent, such gaps would expose the electrode to unwanted coating. This would make it necessary to clean the electrode periodically, thus defeating the goal of having a continuous coating process.

Further, this solution is not well suited for coating non-conductive substrates on commercial "in-line" coaters. The Hartig patent teaches use of a high frequency (HF) power supply to establish current flow through non-conductive substrates. Unfortunately, HF cathodes are only available in sizes that allow coating a width of up to about 48", whereas large area substrates (e.g., glass for architectural or automotive applications) commonly exceed this width. Moreover, it is extremely difficult to match the output impedance of an HF power supply to the constantly changing impedance of a plasma. The mismatching of impedance creates arcing, which can be damaging to the substrate and chamber. Further, it is difficult to achieve uniform distribution of HF power along the cathode when impedance mismatching occurs. This can cause non-uniformity among different areas of the coating. Thus, it would not be practical to deposit coatings on non-conductive large area substrates using high frequency power supplies.

The Hartig patent also indicates that direct current (DC) cathodes can be used. Insofar as non-conductive substrates are concerned, a DC cathode would create a negative electric field on a non-conductive substrate. This negative electric field would make it extremely difficult to maintain stable plasma, which is necessary for uniform film deposition.

Therefore, a DC power supply would not be desirable for coating non-conductive substrates using the equipment of the Hartig patent.

It would be desirable to provide methods and equipment for continuously coating substrates without the problems discussed above.

SUMMARY OF THE INVENTION

In certain embodiments, the present invention provides an apparatus for depositing films onto substrates. The apparatus comprises a deposition chamber having a substrate-coating region (e.g., wherein a substrate spaced apart from the electrode 28 is coated by plasma-enhanced chemical vapor deposition) and an electrode-cleaning region (e.g., wherein an outer surface of the electrode 28 is cleaned of contamination by sputtering). The electrode has an interior cavity with first and second magnet systems within the deposition chamber.

Certain aspects of the invention provide an electrode assembly for a film-deposition apparatus, which comprises a rotatable electrode (optionally having an outer coating of low sputter rate material, such as carbon) having an interior cavity and stationary first and second generally-opposed magnet systems disposed within the interior cavity (optionally a first magnet system oriented in one direction and a second magnet system oriented in another direction, wherein the first magnet system is adapted to create a more narrow plasma confinement than the second magnet system).

Certain embodiments of the invention provide an apparatus for depositing films onto substrates, which comprises a deposition chamber having a substrate-coating region in which a first gaseous atmosphere can be established and an electrode-cleaning region in which a second gaseous atmosphere can be established. A rotatable electrode is positioned in the deposition chamber and has an interior cavity wherein stationary first and second magnet systems are disposed. The first magnet system is adapted to create a first plasma confinement in the first gaseous atmosphere and the second magnet system is adapted to create a second plasma confinement in the second gaseous atmosphere.

Certain aspects of the invention provide a method for depositing films onto substrates, which comprises providing a film-deposition apparatus comprising a deposition chamber having a substrate-coating region and an electrode-cleaning region. An electrode having an interior cavity and first and second magnet systems is positioned in the deposition chamber. A first gaseous atmosphere comprising a precursor gas is established in the substrate-coating region. A second gaseous atmosphere comprising a sputtering gas is established in the electrode-cleaning region. A cathodic charge is delivered to the electrode, thereby creating plasma in the first gaseous atmosphere that is held by the first magnet system in a first plasma confinement. Plasma is also created in the second gaseous atmosphere that is held by the second magnet system in a second plasma confinement. The precursor gas is chemically reacted and/or decomposed in the first plasma confinement. A substrate is positioned in the substrate-coating region exposing the substrate to the chemically-reacting and/or decomposing precursor gas such that coating is formed on the substrate.

In certain embodiments, the invention provides a film-deposition apparatus. The apparatus comprises a deposition chamber having a substrate-coating region and an electrode-cleaning region, wherein a first gaseous atmosphere can be established in the substrate-coating region while a second gaseous atmosphere (preferably having a different composition than the first atmosphere) can be established in the electrode-cleaning region. A rotatable electrode is positioned in the deposition chamber and has an interior cavity. First and second magnet systems are disposed in said interior cavity. In some cases, a substrate in the substrate-coating region has a first major surface oriented away from the rotatable electrode, and operation of the film-deposition apparatus coats the first major surface of the substrate. In some such cases, the substrate is a glass sheet. Preferably, the rotatable electrode has an outer surface that is sputtered clean of unwanted contamination (e.g., is sputtered substantially clean of any coating on the outer surface of the electrode) in the electrode-cleaning region. In certain embodiments, the electrode-cleaning region, in which the electrode is sputtered clean, does not contain any substrate or any substrate support. In these embodiments, the region 16 of the chamber in which sputtering occurs does not contain a substrate to be coated. Rather, the substrate to be coated in these embodiments is in a region 14 of the chamber wherein preferably no sputtering occurs. In some cases, the first magnet system is oriented toward the substrate-coating region and the second magnet system is oriented toward the electrode-cleaning region. In some embodiments, the substrate-coating region contains the first gaseous atmosphere and the electrode-cleaning region contains the second gaseous atmosphere. In certain embodiments of this nature, the electrode is exposed to both the first and second gaseous atmospheres. In some aspects of the invention, the first magnet system in adapted to create a first plasma confinement in the first gaseous atmosphere and the second magnet system is adapted to create a second plasma confinement in the second gaseous atmosphere. Preferably, the first gaseous atmosphere comprises a precursor gas and the second gaseous atmosphere comprises a sputtering gas. The sputtering gas commonly is inert gas. The precursor gas preferably is chemically reacted and/or decomposed in the first plasma confinement such that coating is formed on a substrate that is exposed to the chemically-reacting and/or decomposing precursor gas in the first plasma confinement. For example, the substrate can have a first major surface oriented away from the rotatable electrode, such that the first major surface receives the coating. Optionally, the substrate has a second major surface oriented toward the rotatable electrode and this second major surface remains substantially uncoated during the exposure of the substrate in the first plasma confinement. In certain embodiments, the sputtering gas is converted to plasma in the second plasma confinement and bombards an outer surface of the electrode, thereby cleaning unwanted contamination from the outer surface of the electrode. In some aspects of the invention, the rotatable electrode is cylindrical and is rotatable about its longitudinal axis. In certain embodiments, the first and second magnet systems are stationary. Further, in certain embodiments, the first and second magnet systems are disposed in a generally-opposed configuration. The first and second magnet systems can optionally each comprise an elongated magnetic array. Preferably, the substrate support is positioned in the substrate-coating region of the deposition chamber. In some embodiments, the substrate support is adapted to convey a series of spaced-apart sheet-like substrates. In some cases, the substrate-coating region of the chamber is at a higher elevation than the electrode-cleaning region of the chamber, and the substrate support is adapted to retain a substrate above the rotatable electrode. In some such cases, the substrate support comprises a series of spaced-apart transport rollers adapted to convey substrates over the rotatable electrode. Preferably, the substrate support defines a path of substrate travel a desired portion of which is adjacent the electrode. Further, the first magnet system is desirably adapted to create a first plasma confinement about the desired portion of the path of substrate travel. In some cases, the first magnet system is adapted to create a first plasma confinement defining a magnetic trap that closes over a surface of a substrate on the desired portion of the path of substrate travel. For example, the first gaseous atmosphere can optionally comprise a precursor gas that is chemically reacted and/or decomposed in the first plasma confinement such that a substrate on the desired portion of the path of substrate travel is exposed to the chemically-reacting and/or decomposing precursor gas and is thereby coated. For example, the substrate can optionally have a first major surface that is oriented away from the rotatable electrode, such that the first major surface of the substrate is coated. Further, in some cases, the substrate has a second major surface that is oriented toward the rotatable electrode, and the second major surface remains substantially uncoated during the exposure of the substrate in the first plasma confinement. The rotatable electrode can optionally have an outer layer of low sputter rate material (e.g., carbon or carbon-based material). For example, the electrode can comprise a backing tube on which the outer layer of low sputter rate material is carried. In some cases, the apparatus further comprising a gas delivery system adapted for delivering a precursor gas to the substrate-coating region and a sputtering gas to the electrode-cleaning region. In some embodiments, a first vacuum pump is operably connected to the substrate-coating region and a second vacuum pump is operably connected to the electrode-cleaning region. The deposition chamber is preferably adapted for separate gas delivery and vacuum pumping of the substrate-coating region and the electrode-cleaning region. In some embodiments, the deposition chamber includes a divider between the substrate-coating region and the electrode-cleaning region. When provided, the divider can optionally comprise two spaced-apart walls bounding an intermediate atmosphere. Further, the apparatus can optionally comprise a vacuum pump in communication with the intermediate atmosphere.

In certain embodiments, the invention provides a method for depositing films onto substrates. The method comprises: a) providing a film-deposition apparatus comprising a deposition chamber having a substrate-coating region and an electrode-cleaning region, a rotatable electrode positioned in the deposition chamber and having an interior cavity, and first and second magnet systems disposed in said interior cavity; b) establishing in the substrate-coating region a first gaseous atmosphere comprising a precursor gas; c) establishing in the electrode-cleaning region a second gaseous atmosphere comprising a sputtering gas; d) delivering a charge to the electrode, thereby creating in the first gaseous atmosphere plasma that is held by the first magnet system in a first plasma confinement and creating in the second gaseous atmosphere plasma that is held by the second magnet system in a second plasma confinement, the precursor gas being chemically reacted and/or decomposed in the first plasma confinement; and e) positioning a substrate in the substrate-coating region and exposing the substrate to the chemically-reacting and/or decomposing precursor gas in the first plasma confinement such that coating is formed on the substrate. In some cases, the substrate is positioned in the substrate-coating region and has a first major surface oriented away from the rotatable electrode, and the coating is formed on the first major surface of the substrate. Optionally, the substrate has a second major surface that is oriented toward the rotatable electrode and that remains substantially uncoated during the exposure of the substrate in the first plasma confinement. In certain embodiments, the method comprises conveying a series of spaced-apart substrates through the substrate-coating region and exposing the substrates to the chemically-reacting and/or decomposing precursor gas such that coatings are formed on the substrates. In some embodiments, the electrode is exposed to the second gaseous atmosphere such that plasma in the second plasma confinement bombards an outer surface of the electrode, thereby cleaning unwanted contamination from the outer surface of the electrode. Optionally, the electrode is rotated continuously during film deposition, and unwanted contamination is cleaned continuously from the outer surface of the electrode. In certain embodiments, the electrode is cylindrical and is rotated about its longitudinal axis. In some cases, the substrate is positioned in the substrate-coating region and exposed to the chemically-reacting and/or decomposing precursor gas by conveying the substrate along a substrate support that defines a path of substrate travel a desired portion of which is adjacent the electrode and is in the first plasma confinement. In some such cases, the substrate is a glass sheet, the substrate support comprises a series of spaced-apart transport rollers, and the glass sheet is conveyed over the rollers.

BRIEF DESCRIPTION OF THE DRAWINGS

FIG. 2 is a schematic perspective illustration of an electrode assembly for a film-deposition apparatus in accordance with certain embodiments of the invention;

DETAILED DESCRIPTION OF PREFERRED EMBODIMENTS

Figure 1:
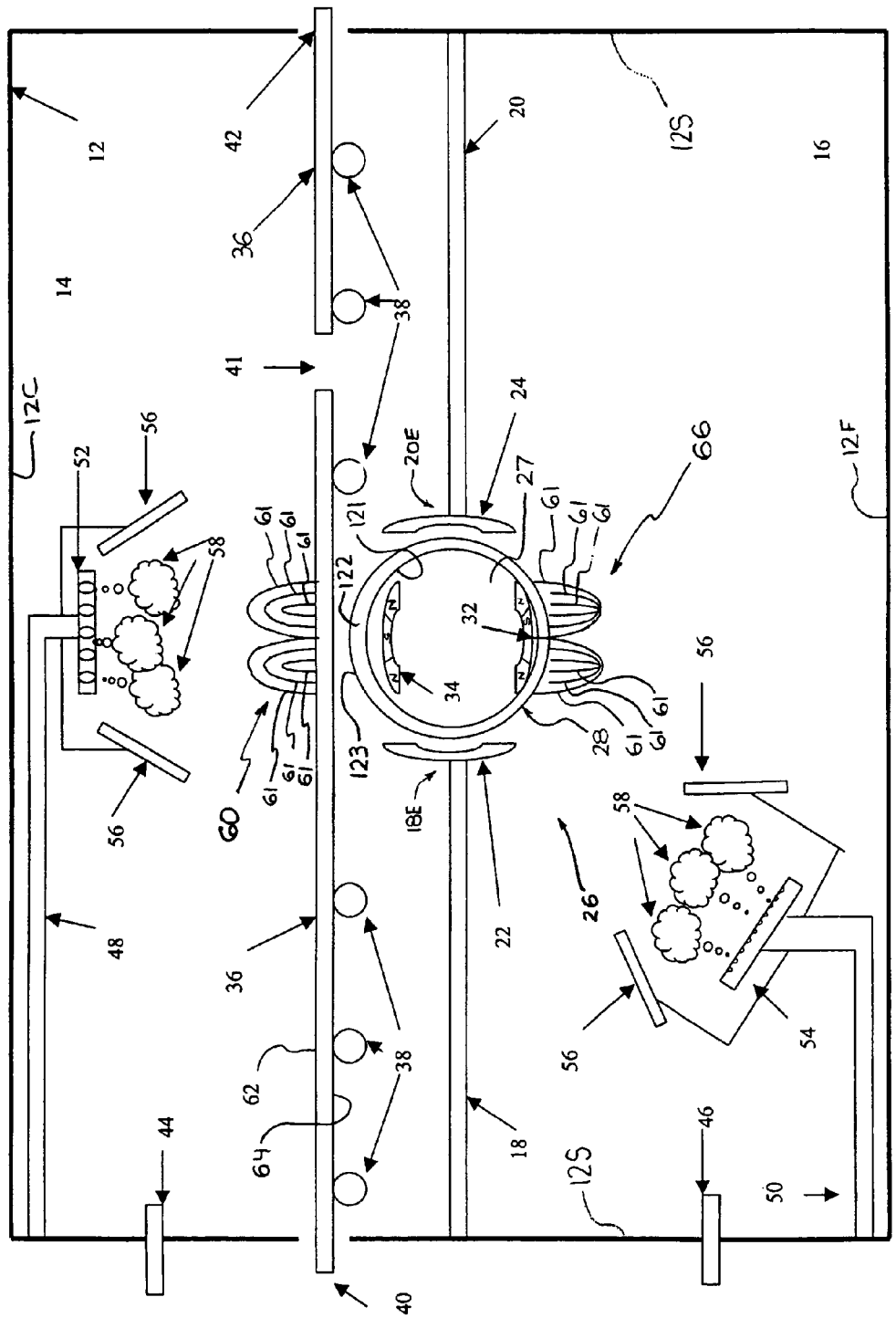
FIG. 1 is a cross-sectional side illustration of an apparatus for depositing films onto substrates in accordance with certain embodiments of the present invention.

The following detailed description is to be read with reference to the drawings, in which like elements in different drawings have been given like reference numerals. The drawings, which are not necessarily to scale, depict selected embodiments and are not intended to limit the scope of the invention. Skilled artisans will recognize that the examples given have many useful alternatives that fall within the scope of the invention.

FIG. 1 is a cross-sectional side illustration of an apparatus for depositing films onto substrates in accordance with certain embodiments of the present invention. This apparatus generally includes a deposition chamber 12 and an electrode 28. The deposition chamber 12 preferably has a substrate-coating region 14 and an electrode-cleaning region 16. During use, film deposition occurs (e.g., on a substrate adjacent the electrode 28) in the substrate-coating region 14, while unwanted contamination can be cleaned from the electrode 28 in the electrode-cleaning region 16. The electrode 28 is positioned in the deposition chamber 12, for example, between the substrate-coating region 14 and the electrode-cleaning region 16. In some cases, the substrate-coating region 14 is at a higher elevation than (i.e., is located above) the electrode-cleaning region 16. Preferably, the electrode 28 has an interior cavity 27 in which first 34 and second 32 magnet systems are disposed. The first 34 and second 32 magnet systems are adapted respectively to create first 60 and second 66 plasma confinements in the deposition chamber 12.

Thus, the deposition chamber 12 preferably has both a substrate-coating region 14 in which film deposition can be performed (e.g., in which film is deposited by plasma-enhanced vapor deposition upon a substrate conveyed through this region 14) and an electrode-cleaning region 16 in which unwanted contamination can be cleaned from the electrode 28 (e.g., in which unwanted contamination is sputtered off an outer surface of the electrode 28). During use, the substrate-coating region 14 preferably contains a first gaseous atmosphere and the electrode-cleaning region 16 preferably contains a second gaseous atmosphere. These gaseous atmospheres preferably have different compositions. For example, in certain embodiments the electrode-cleaning region 16 contains an inert (or substantially inert) atmosphere while the substrate-coating region 14 contains a reactive atmosphere. With respect to the substrate-coating region 14, this region 14 preferably contains a gaseous atmosphere comprising a precursor gas, as described below. With respect to the electrode-cleaning region 16, this region 16 preferably contains a gaseous atmosphere comprising a sputtering gas. In particular, this atmosphere (i.e., the second gaseous atmosphere) preferably comprises an inert sputtering gas, such as argon or another noble gas. The term "sputtering gas" is used herein to refer to any gas (inert or reactive) that provides a suitable medium for establishing and stably maintaining a plasma (e.g., a glow discharge). Argon is a preferred sputtering gas given its high atomic mass and high sputtering yield. However, skilled artisans will recognize that a variety of other sputtering gases can be used.

Thus, it can be appreciated that certain embodiments provide a deposition chamber in which first and second gaseous atmospheres can be established. Preferably, these gaseous atmospheres are substantially isolated from each other (e.g., by differential pumping). In some embodiments, the electrode 28 is exposed during use to both the first and second gaseous atmospheres. The first 34 and second 32 magnet systems within the interior 27 of the electrode 28 are preferably adapted respectively to create a first plasma confinement 60 in the first gaseous atmosphere and a second plasma confinement 66 in the second gaseous atmosphere.

Thus, the first magnet system 34 is preferably oriented toward the substrate-coating region 14, and the second magnet system 32 is preferably oriented toward the electrode-cleaning region 16. This results in the first plasma confinement 60 being located in the substrate-coating region 14 (e.g., adjacent to, and enveloping, a desired portion of a path of substrate travel, which is preferably spaced a short distance from the electrode 28), and the second plasma confinement 66 being located in the electrode-cleaning region 16 (e.g., adjacent the electrode 28).

With regard to the substrate-coating region 14 of the chamber 12, the action of the plasma in the first confinement 60 causes precursor gas in the first gaseous atmosphere to undergo a chemical reaction and/or decomposition that facilitates film deposition. When a substrate 36 (e.g., a glass sheet) is exposed to the chemically-reacting and/or decomposing precursor gas in the first plasma confinement 60, coating is formed on the substrate 36. This coating condenses from the gas phase and coats a desired surface 62 of the substrate 36 (i.e., the surface 62 over which the first plasma confinement 60 is closed), which surface 62 is exposed to the first plasma confinement 60 and thus to the chemically-reacting and/or decomposing precursor gas in the first plasma confinement 60. Preferably, the substrate has a first major surface 62 that is oriented (i.e., faces) away from the electrode 28 and that is coated during its exposure to he chemically-reacting and/or decomposing precursor gas in the first plasma confinement 60. Thus, the invention provides continuous film deposition from the gas phase. This film deposition can be performed on an uninterrupted basis, since production stops for cleaning and target change-outs are avoided. As a result, the invention provides an outstanding boost in productivity.

As noted above, the first gaseous atmosphere desirably comprises a precursor gas (e.g., diluted silane). Preferably, the precursor gas comprises material that condenses (by a chemical reaction and/or a decomposition) upon the substrate during film deposition. A wide variety of precursor gases can be used. For example, a variety of inorganic films can be formed on the substrate from gaseous or volatile compounds, such as of silicon, germanium, arsenic, boron, aluminum, titanium, phosphorous, gallium, etc. Further, a variety of polymeric films can be formed on the substrate from polymerizable monomers, such as methyl methacrylate (to form polymethylmethacrylate). Metal-containing films can be formed on the substrate from organometallics. Silicon-containing films can be formed on the substrate from silanes, tetraethylorthosilicate (TEOS), tetramethyl orthosilicate (TMOS), octamethylcyclotetrasiloxance (OMCTS), or tetramethylcyclotetrasiloxane (TMCTS). Carbon-containing films can be formed on the substrate from hydrocarbon compounds, such as $C_2H_2$ or $C_4H_{10}$. Skilled artisans will recognize that a variety of precursor gases can be provided in the coating region 14 to form on the substrate 36 various types of films.

In one particular method wherein silica is deposited, the coating region 14 is provided with silane ($SiH_4$) and oxygen ($O_2$), optionally along with nitrogen ($N_2$) and/or an inert gas, such as argon (Ar) or helium (He). In another particular method wherein silica is deposited, the coating region 14 is provided with tetraethylorthosilicate (TEOS) and oxygen, optionally along with an inert gas. In one particular method wherein silicon nitride ($Si_3N_4$) is deposited, the coating region 14 is provided with a silane-based gas, such as silane or dichlorosilane ($SiH_2Cl_2$), along with a nitrogen-containing gas, such as nitrogen ($N_2$) or ammonia ($NH_3$), optionally together with an inert gas. In one particular method wherein silicon is deposited, the coating region 14 is provided with silane and an inert gas. In one particular method wherein titanium nitride is deposited, the coating region 14 is provided with titanium tetrachloride gas and a nitrogen-containing gas, such as nitrogen or ammonia, optionally together with an inert gas. In one particular method wherein aluminum nitride is deposited, the coating region 14 is provided with methylaluminum $(Al(CH_3)_3)$ gas along with an inert gas. In one particular method wherein polymethylmethacrylate is deposited, the coating region 14 is provided with methyl methacrylate $(C_5H_8O_2)$ along with a nitrogen-containing gas, such as nitrogen or ammonia, optionally together with an inert gas.

A particularly advantageous aspect of the invention is that condensation of the precursor gas occurs only in the immediate vicinity of the first plasma confinement 60 (i.e., in the substrate-coating region 14 adjacent the first magnet system 34/adjacent the desired portion of the path of substrate travel). The spatial extent of the plasma in the substrate-coating region 14 is preferably limited to the area of the first plasma confinement 60. Therefore, the conditions required for film deposition (e.g., the action of plasma upon precursor gas) preferably only exist in the area of the first plasma confinement 60. Accordingly, film deposition is preferably restricted to this immediate area. As a result, coating preferably does not form on interior surfaces of the deposition chamber 12 remote from the electrode 28. Thus, it can be appreciated that the invention can obviate problems associated with the growth of a contamination layer (spalling, flaking, or peeling of the contamination layer, vanishing/poisoned anode, etc.). Moreover, since coating preferably occurs only in the area of the first plasma confinement 60, there can be achieved a high degree of utilization of the precursor gas/coating material. Since the precursor gas and the resulting coating material can be quite expensive, this is highly desirable. Further, the invention achieves films that are of particularly high quality. Since coating occurs only in the area of the first plasma confinement 60, there is little likelihood of the film being deposited at acute angles (which is preferably avoided). Thus, the film grows in a very homogenous manner.

During operation, a certain amount of film may condense upon the electrode 28. For example, the apparatus can be used to coat a plurality (e.g., a series) of spaced-apart substrates (e.g., glass sheets), wherein gaps 41 between adjacent substrates are maintained during coating (e.g., during conveyance of the spaced-apart substrates through the chamber). When these gaps 41 are aligned with the electrode 28 (as occurs repeatedly when spaced-apart substrates 36 are conveyed past the electrode 28), the gaps 41 expose the electrode 28 to the chemically-reacting and/or decomposing precursor gas in the first plasma confinement 60. Thus, it can be appreciated that a certain amount of contamination may form on the electrode 28 during the coating process. This contamination, however, can be readily removed (entirely or to a desired extent) by operation of the electrode-cleaning region 16.

The electrode 28 has an advantageous cylindrical configuration in certain preferred embodiments. In these embodiments, any unwanted coating that builds-up on the electrode 28 is spread over the large cylindrical outer surface of the electrode 28. Thus, any coating that builds-up on the electrode 28 does so relatively slowly, given its large exterior surface area. Moreover, the unique design and method of operating the present apparatus facilitates removal of unwanted contamination on the electrode 28 by the action of plasma in the second plasma confinement 66, as will now be described.

The action of the plasma in the second confinement 66 has a cleaning effect on the electrode 28. In FIG. 1, it can be appreciated that the illustrated electrode 28 is exposed to the gaseous atmosphere in the electrode-cleaning region 16 of the chamber 12. As noted above, the second magnet system 32 localizes the second plasma confinement 66 in region 16 adjacent the electrode 28. Thus, the electrode 28 is exposed to the plasma in the second confinement 66. In some embodiments, positively-charged particles (e.g., ions) in this plasma are attracted to the negatively-charged electrode 28 and bombard its outer surface 123 (these relative charges can be reversed, switched, etc., if so desired). This has the effect of sputtering away unwanted coating that has condensed upon the outer surface 123 of the electrode 28. Thus, it can be appreciated that the plasma in the second confinement 66 cleans (i.e., removes) unwanted contamination from the electrode 28, thereby allowing the apparatus to be operated continuously without having to stop and manually remove coating from the electrode 28.

A further aspect of the invention involves selecting and utilizing an electrode cleaning rate (i.e., the rate at which coating is sputtered off the electrode) that removes unwanted coating from the electrode without significantly sputtering away the material of the electrode. This can be done by determining the rate at which unwanted coating builds-up on the electrode 28 during a given film deposition process (i.e., the electrode-coating rate) and selecting cleaning process parameters that yield a substantially equal electrode-cleaning rate (i.e., the rate at which the coating material in question is sputtered off the electrode). By operating the apparatus continuously at these parameters (e.g., by continuously performing both film deposition and electrode cleaning), the electrode 28 can be kept substantially free of undue coating build-up, while preventing the material of the electrode 28 itself from being sputtered away. In some cases, it may be preferable to allow a small thickness of coating to remain on the electrode to assure that the material of the electrode 28 is not sputtered away.

The electrode-cleaning process is not required to be performed continuously at all times during the substrate-coating process. Rather, in certain alternate embodiments, the electrode-cleaning process is performed periodically while the substrate-coating process is performed continuously. For example, each time the cleaning process is performed, it may be continued only until all of the coating is removed from the electrode, or until only a desired thickness of coating remains on the electrode 28. Thereafter, the cleaning process can be stopped or substantially stopped (e.g., by evacuating the electrode-cleaning region 16) until such time as another period of cleaning is desired. In these alternate embodiments, the substrate-coating process can advantageously be performed continuously even when the electrode-cleaning process is stopped. For example, the electrode-cleaning process can be performed for a desired period of time, which period of time is determined (e.g., has been predetermined) for a given process to bring about a desired amount of removal from the electrode (e.g., complete removal or removal of all but a desired thickness) of the coating material in question.

Certain embodiments of the invention provide an electrode assembly 26. The electrode assembly 26 in these embodiments generally includes an electrode 28 and two magnet systems 32, 34. With reference to FIGS. 5–8, it can be appreciated that the electrode 28 preferably has (i.e., bounds) an interior cavity 27 in which the first 34 and second 32 magnet systems are disposed. Preferably, the electrode 28 is rotatable while the first 34 and second 32 magnet systems are stationary.

The preferred electrode 28 has a cylindrical or tubular configuration and is formed of an electrically-conductive material, such as stainless steel, aluminum, copper, titanium, or any other suitably conductive material. With continued reference to FIGS. 5–8, it can be appreciated that the preferred electrode 28 comprises a cylindrical or tubular wall 122. For example, the electrode 28 can comprise an elongated tube of electrically-conductive material. In some cases, the electrode comprises a conventional backing tube for a cylindrical sputtering target. In such cases, the backing tube does not have (i.e., is provided without) the outer layer of sputterable target material. Rather, the outer surface 123 of the electrode 28 is defined by the backing tube 122 itself, or by a layer 177 of low sputter rate material (described below), as is provided in certain embodiments. While a cylindrical electrode 28 is depicted in the drawings, various other configurations can be used for the electrode 28.

Figure 5A:
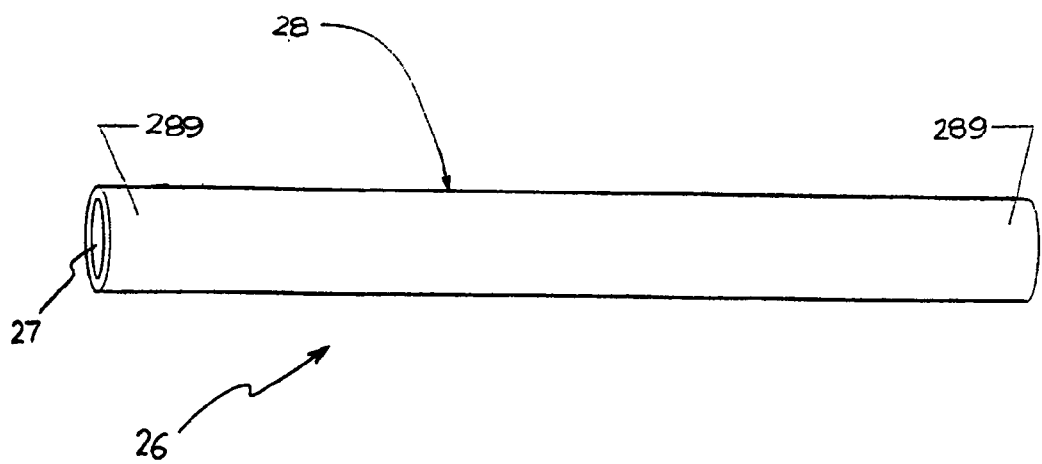
FIG. 5A is a perspective illustration of an electrode assembly in accordance with certain embodiments of the invention.
Figure 5B:
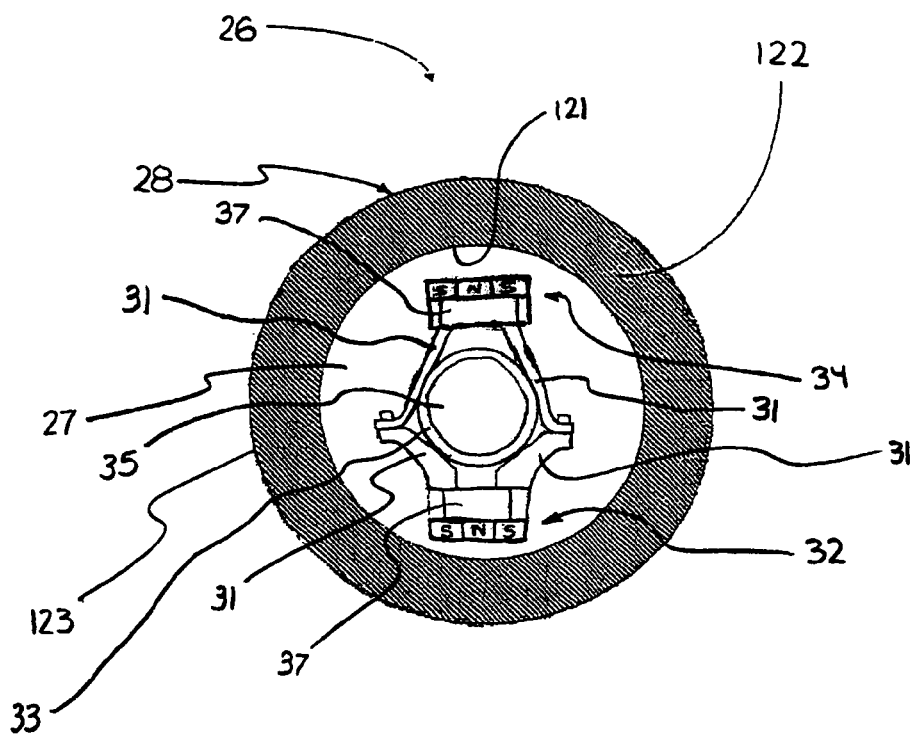
FIG. 5B is a cross-sectional illustration of the electrode assembly of FIG. 5A.
Figure 6:
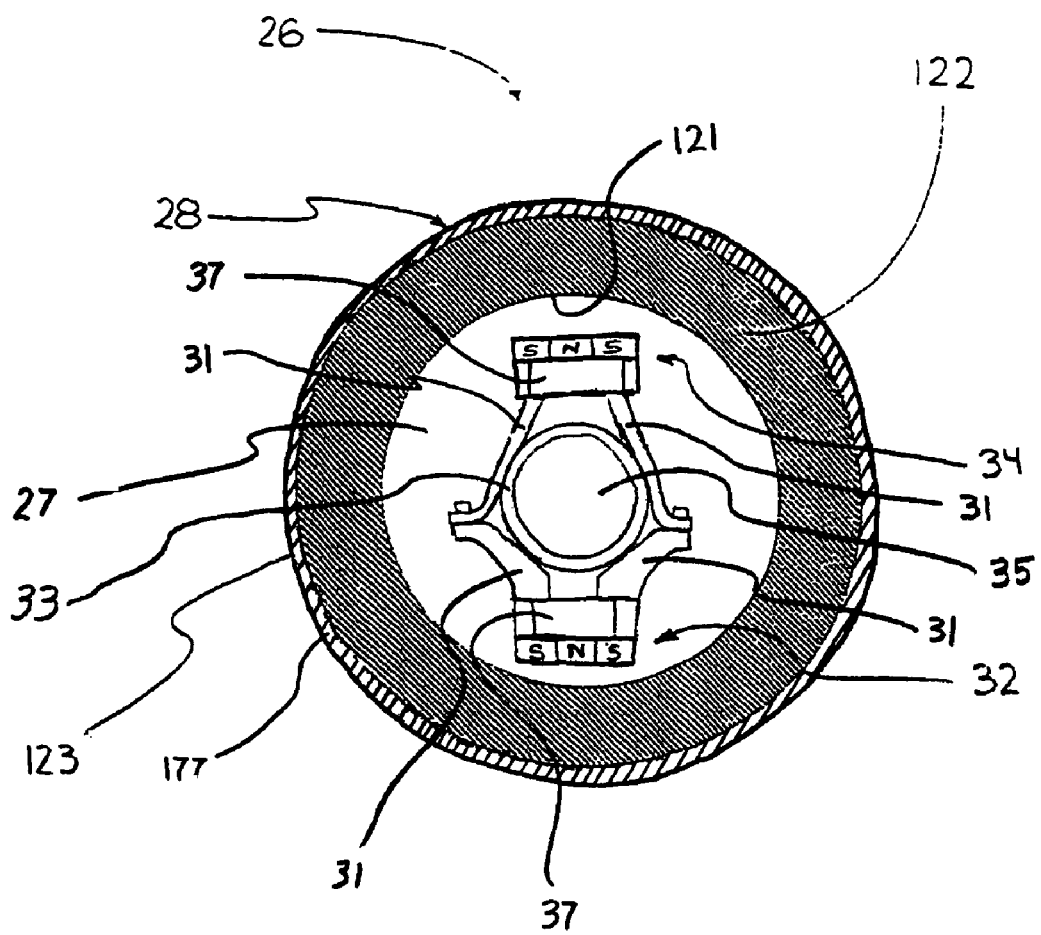
FIG. 6 is a cross-sectional illustration of an electrode assembly in accordance with certain embodiments of the invention.

As is perhaps best appreciated with reference to FIGS. 5B and 6, the first 34 and second 32 magnet systems are disposed in a generally-opposed configuration in certain preferred embodiments. For example, the first magnet system 34 can be upwardly oriented while the second magnet system 32 is downwardly oriented. However, this is by no means a requirement. Preferably, the first magnet system 34 is oriented toward the substrate-coating region 14 and the second magnet system 32 is oriented toward the electrode-cleaning region 16. These two regions 14, 16 are on opposite sides of the electrode 28 (e.g., respectively above and below the electrode) in the illustrated chamber 12. Thus, the first 34 and second 32 magnet systems in this chamber 12 are generally opposed. However, the deposition chamber 12 can alternatively be configured such that the first 34 and second 32 magnet systems are not generally-opposed when facing the coating region 14 and the cleaning region 16, respectively.

Referring now to FIGS. 1 and 5–8, each of the magnet systems 32, 34 can be any suitable type of magnet or magnet assembly. Preferably, each magnet system is adapted to create a closed magnetic trap. For example, each of the magnet systems 32, 34 can be set up in a so-called "2-to-1 scheme". Thus, if there are two north poles in each magnet system, then there is preferably one south pole located between the two north poles. Likewise, if there are two south poles in each magnet system, then there is preferably one north pole located between the two south poles. In some cases, each magnet system comprises an elongated magnetic array. For example, each magnet system can comprise an array of magnetic poles arranged in rows extending substantially the entire length of the electrode 28. In more detail, all of the poles in a given row can have the same polarity, and the rows can have alternating polarity. For example, there can be three rows having respective north-south-north polarities or respective south-north-south polarities. If so desired, each magnet system 32, 34 can comprise a conventional magnet assembly for cylindrical magnetron sputtering, provided that one of the magnet systems 34 is oriented (e.g., upwardly) toward the coating region 14, while the other 32 is oriented (e.g., downwardly) toward the cleaning region 16.

With reference to FIG. 1, it can be appreciated that each magnet system creates lines of magnetic flux 61 in the deposition chamber 12. Preferably, the first magnet system 34 creates lines of flux 61 which extend into the substrate-coating region 14, and the second magnet system 32 creates lines of flux 61 which extend into the electrode-cleaning region 16. The lines 61 of flux from each magnet system preferably extend from pole to pole.

The lines 61 of flux from the first magnet system 34 preferably extend from inside the electrode 28, through the wall 122 of the electrode 28, and through a substrate 36 (during film deposition), closing over the substrate surface 62 that is to be coated (which preferably is oriented away from the electrode 28). Thus, the first magnet system 34 preferably creates a closed magnetic trap (which preferably closes of surface 62) which limits the spatial extent of the first plasma confinement 60. As noted above, the conditions required for film deposition (e.g., the action of plasma on a precursor gas) are thus localized adjacent the electrode 28 and about a desired portion of the path of substrate travel (which is defined by the substrate supports 38).

In certain embodiments, the first magnet system 34 is of sufficient strength to emit magnetic flux lines 61 a predetermined distance above the surface 62 of a desired substrate 36 (e.g., a glass sheet) positioned on the substrate supports 38. In certain embodiments, the first magnet system 34 is of sufficient strength to emit flux lines 61 at least about ¾ inch, more preferably at least about 1 inch, and perhaps optimally at last about 2 inches above the surface 62 of the substrate 36.

The lines 61 of flux from the second magnet system 32 preferably extend from inside the electrode 28, through the wall 122 of the electrode 28, and into the electrode-cleaning region 16, closing over the outer surface 123 of the electrode 28. Thus, the second magnet system 32 preferably creates a closed magnetic trap which limits the spatial extent of the second plasma confinement 66. Since the outer surface 123 of the electrode 28 is preferably exposed to the plasma discharge of the second plasma confinement 66, any unwanted coating on the outer surface 123 of the electrode 28 can be removed (i.e., sputtered away) by ion bombardment from the plasma in the second plasma confinement 66. In certain embodiments, the second gaseous atmosphere (i.e., the gaseous atmosphere in the electrode-cleaning region 16) is substantially free of gas that decomposes and/or chemically reacts (so as to form a coating on surfaces) in the second plasma confinement 66. For example, the second gaseous atmosphere may consist essentially of inert gas.

It can be appreciated that certain embodiments provide an upper magnet system 34 (e.g., oriented upwardly toward a substrate position) and a lower magnet system 32 (e.g., oriented downwardly away from a substrate position). In some cases, the upper magnet system 34 is more narrow than the lower magnet system 32. That is, the upper magnet system 34 may be adapted to create a more narrow magnet trap than the lower magnet system 32. This would result in the first plasma confinement 66 having a narrower width (e.g., in the left-to-right dimension, as seen in FIG. 1) than the second plasma confinement 60. The relative widths of the first 34 and second 32 magnet systems can be adjusted to achieve a desired balance of coating and cleaning rates. Particularly good film quality may be achieved using a narrow magnet system 34.

The magnet systems 32, 34 can be mounted within the interior 27 of the electrode 28 in a variety of ways. Each magnet system (and the pole faces thereof) preferably lies as close as possible to the inner surface 121 of the electrode 28. FIGS. 5B and 6 depict one suitable manner of mounting the magnet systems 32, 34. The illustrated magnet systems 32, 34 are carried by a stationary, elongated support member 33 that extends axially through the electrode's interior cavity 27. In FIGS. 5B and 6, each magnet system is mounted to the support member 33 by brackets 31. Various other means can be used for mounting the magnet systems 32, 34 on a support member 33 of this nature.

Figure 7A:
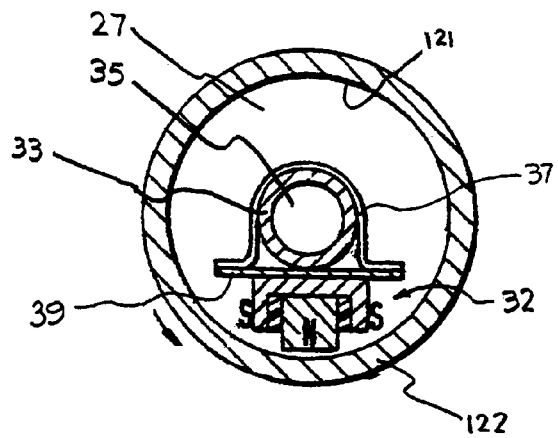
FIG. 7A is a cross-sectional illustration of an electrode assembly in accordance with certain embodiments of the invention.
Figure 7B:
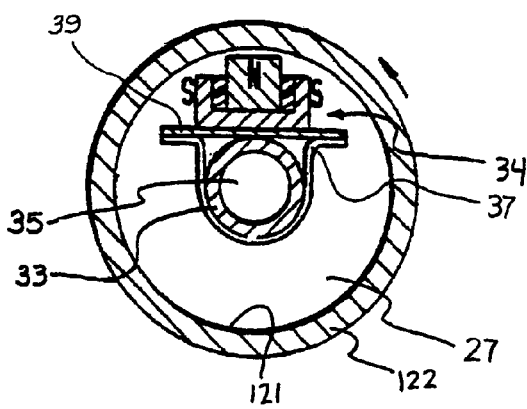
FIG. 7B is a cross-sectional illustration of an electrode assembly in accordance with certain embodiments of the invention.
Figure 7C:
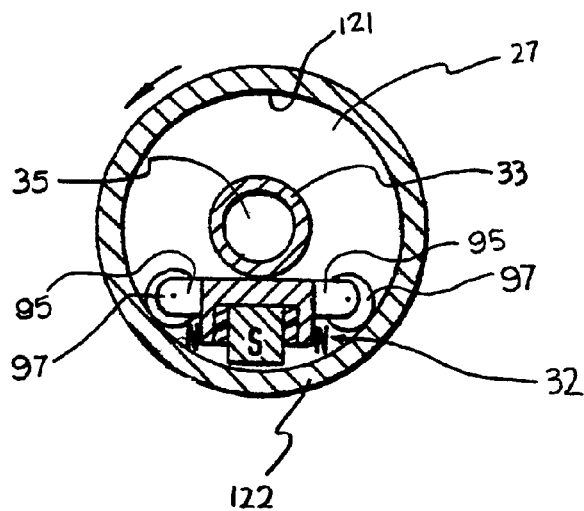
FIG. 7C is a cross-sectional illustration of an electrode assembly in accordance with certain embodiments of the invention.

The magnet systems 32, 34 can be mounted in the interior 27 of the electrode 28 using one or more of the mounting systems shown in FIGS. 7A, 7B, and 7C. Since the magnet systems 32, 34 extend along substantially the entire length of the electrode 28, each magnet system can be attached to the support member 33 at periodic locations along its length. With reference to FIG. 7A, a magnet system 32 is attached to the support member 33 by a bracket comprising a rigid plate 39 and a strap 37. In FIG. 7A, the illustrated second magnet system 32 is oriented downwardly and has a south-north-south polarity arrangement. With reference to FIG. 7B, the same general type of mounting system is shown for the first magnet system 34. In FIG. 7B, the illustrated first magnet system 34 is oriented upwardly with its polarity in a south-north-south arrangement. In the embodiments of FIGS. 7A and 7B, a north-south-north polarity arrangement can alternatively be used.

It may be preferable (particularly for lengthy electrodes 28) to provide one or more roller supports for the second magnet system 32. FIG. 7C depicts a roller support comprising two brackets 95 that extend respectively from opposed lateral sides of the magnet system 32. A roller 97 is mounted (e.g., journaled) at the end of each bracket 95. The rollers 97 are adapted to ride on the electrode's interior surface 121 during rotation of the electrode 28.

Thus, there are preferably two magnet assemblies in the interior of the electrode. This, however, is not strictly required. For example, a single magnet assembly can be provided in alternate embodiments. For example, it is suitable to provide first and second magnet systems embodiment in the form of a single magnet assembly adapted to form a first plasma confinement 66 in the substrate-coating region 14 and a second plasma confinement 60 in the electrode-cleaning region 16. Skilled artisans may wish to utilize various designs of this nature.

In certain embodiments, a coolant (e.g., water) is circulated within the electrode. The temperature of the electrode 28 tends to increase during operation. Thus, it is desirable to cool the electrode 28 (e.g., with water or another cooling fluid) to maintain a desirable electrode temperature. Tubing (e.g., extending from a supply of liquid coolant) can be provided within the interior 27 of the electrode 28. It may be desirable to form such tubing of electrically-nonconductive material. In the embodiments of FIGS. 5–7, the support member 33 itself can carry a cooling fluid (e.g., water can be circulated through the interior cavity 35 of the support member 33). Cooling lines can be mounted against the magnet systems 32, 34, if so desired. For example, the mounting system of FIG. 6 can comprise cooling lines (not shown) between the brackets 31 and the magnet systems, e.g., at regions 37.

As noted above, the electrode 28 can optionally be provided with an outer layer 177 of low sputter rate material. For example, the electrode 28 can comprise a backing tube 122 on which the outer layer 177 of low sputter rate material is carried. In some cases, the electrode is simply provided with a thin outer coating of low sputter rate material. Reference is made to FIG. 6, wherein the electrode 28 has an outer layer 177 of low sputter rate material. In embodiments of this nature, the outer surface 123 of the electrode 28 is defined by the low sputter rate material 177. The optional outer layer 177 of low sputter rate material can be provided to ensure the electrode 28 itself is not sputtered away excessively during the electrode-cleaning process. Any low sputter rate material can be used. Carbon is a preferred low sputter rate material. Thus, the outer layer 177 comprises carbon in certain preferred embodiments. Skilled artisans may wish to utilize other low sputter rate materials. In alternate embodiments, the electrode 28 itself (e.g., the backing tube 122) is formed of a low sputter rate material.

Preferably, the electrode 28 is positioned in the chamber 12 and is held in place by a first support assembly 90 and an optional second support assembly 90. Alternatively, the electrode 28 can be held in place by a single cantilever support (not shown) at one end of the electrode 28. Skilled artisans will appreciate that various means can be used for mounting the electrode 28 in the deposition chamber 12.

Thus, the electrode 28 is disposed within (or partially within) the chamber 12. Preferably, the electrode 28 is mounted rotatably in the chamber 12. For example, the electrode 28 can be mounted for rotation about its longitudinal axis 72. This can be accomplished by rotatably mounting the electrode 28 in the same well known manner (e.g., using known end blocks) that cylindrical sputtering targets are mounted rotatably in sputtering chambers. Skilled artisans will be familiar with such mounting systems.

It can thus be appreciated that the electrode assembly 26 preferably includes means for rotating the electrode 28. For example, the electrode assembly 26 can comprise a motor assembly 30 connected to the electrode 28, such as by bracket or housing structures 90 that function as support assemblies. This is perhaps best appreciated with reference to FIG. 2. The support assemblies 90 (which can be conventional end blocks for cylindrical sputtering targets) can comprise a motor assembly (preferably adapted to maintain continuous rotation of the electrode 28) to which the electrode 28 can be operably adjoined. As is perhaps best appreciated with reference to FIG. 3, the motor assembly preferably comprises a motor source 76, a power supply 78, and a control system 80. The motor assembly 30 may be configured and/or programmed to optimize efficient use of the electrode 28. For example, the motor assembly 30 may be programmed configured and/or to produce a predetermined rotational speed which achieves a desired balance of the coating and cleaning rates. Further, the motor assembly 30 may be adapted (e.g., configured and/or programmed) to produce changes in the rotational speed of the electrode 28, as may be desirable to optimize the cleaning process and the life of the electrode 28. One or more power supplies can be used to provide power to the motor source 76, the conductors/anodes 56, and the electrode 28.

Figure 2:
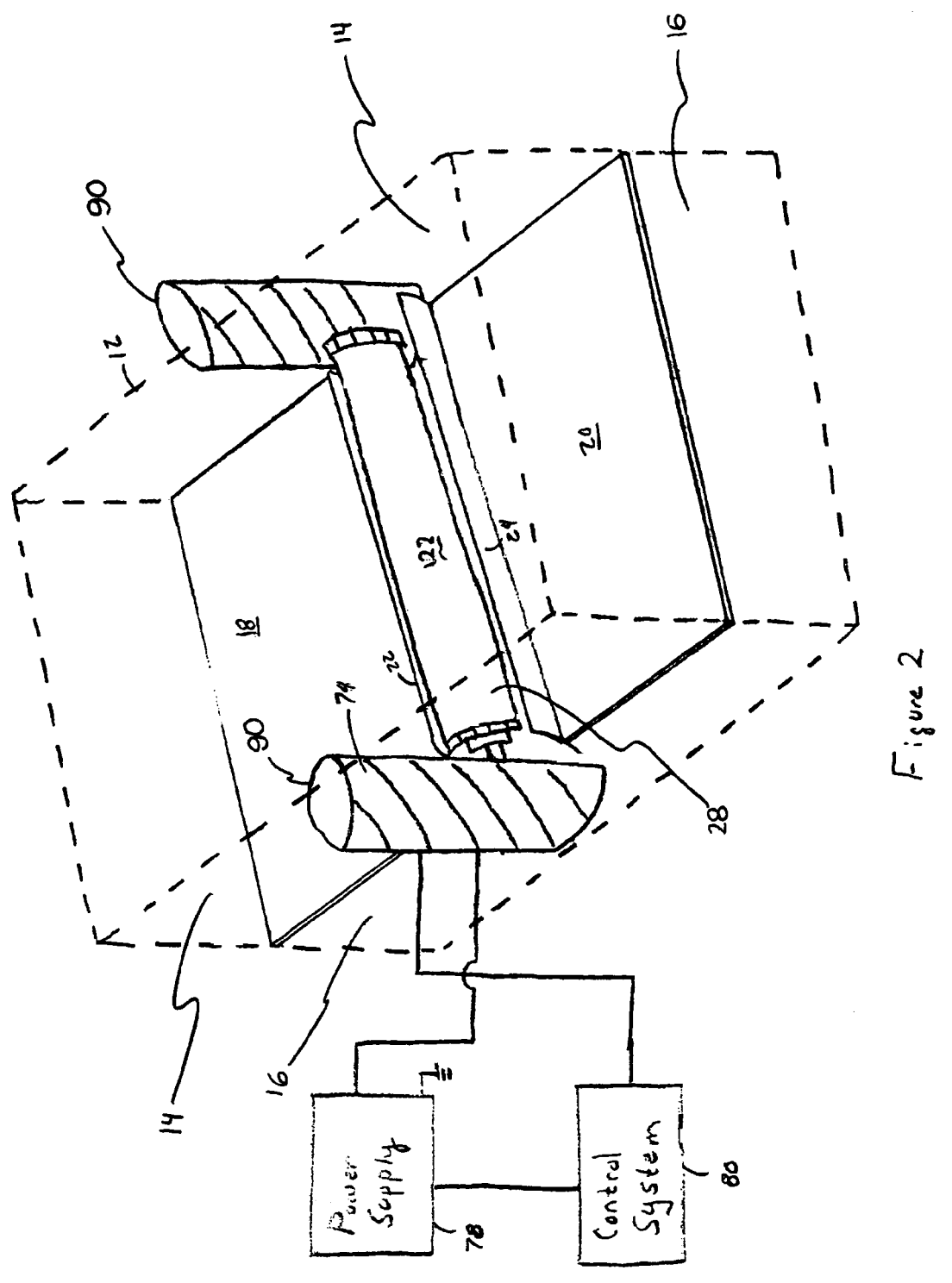

With reference to the embodiment of FIG. 2, it can be appreciated that at least one of the support assemblies 90 preferably comprises (or is operably connected to) a motor 74 for rotating the electrode 28. The motor 74 can be an electric motor, a programmable stepper motor, etc. In FIG. 2, the electrode 28 is mounted on the support assemblies 90 such that the motor 74 is adapted to rotate the electrode 28 about its longitudinal axis 72. Support assemblies 90 (or "end blocks") with such a motor 74 are well known in the present art (e.g., conventional end blocks for a cylindrical sputtering target are suitable for rotatably mounting the present electrode 28).

Figure 3:
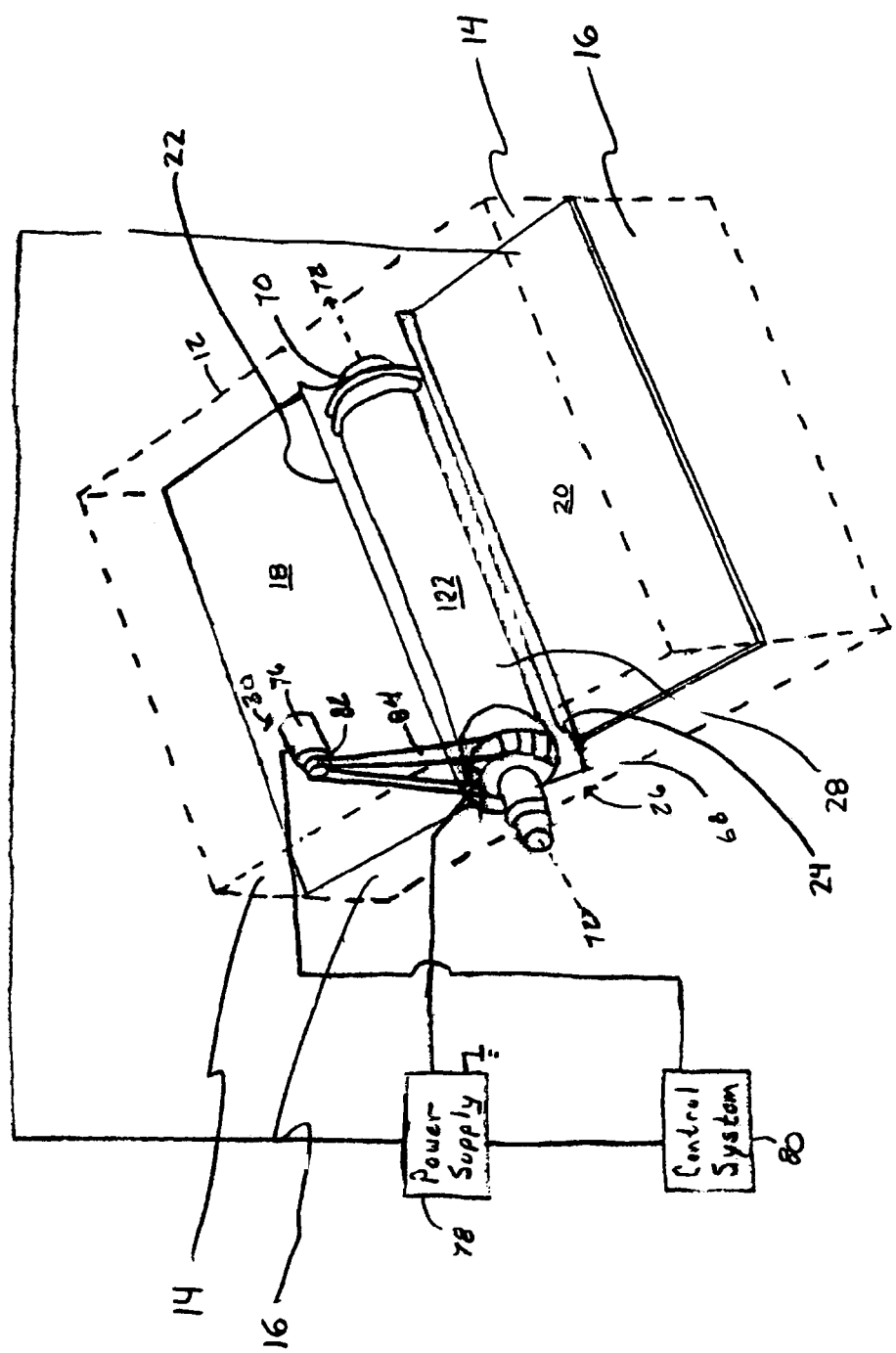
FIG. 3 is a schematic perspective illustration of an electrode assembly for a film-deposition apparatus in accordance with certain embodiments of the invention.
Figure 4A:
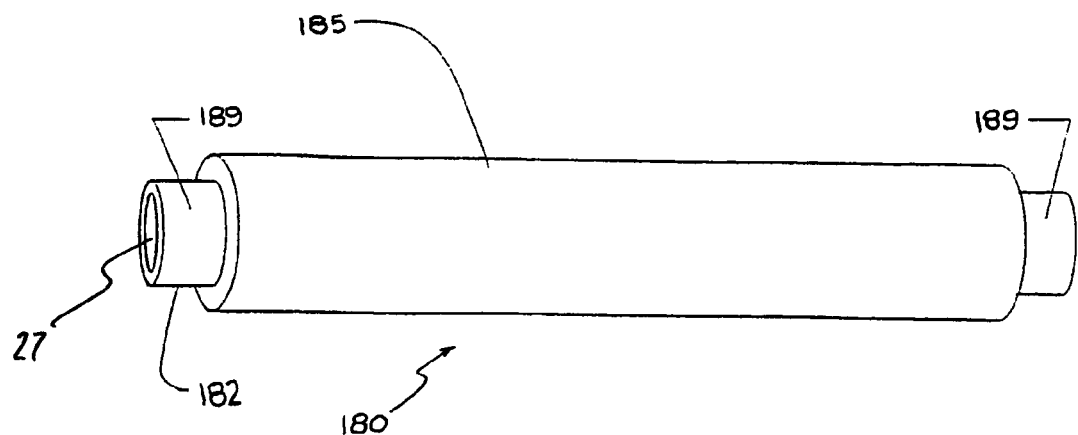
FIG. 4A is a perspective illustration of a cylindrical sputtering target.
Figure 4B:
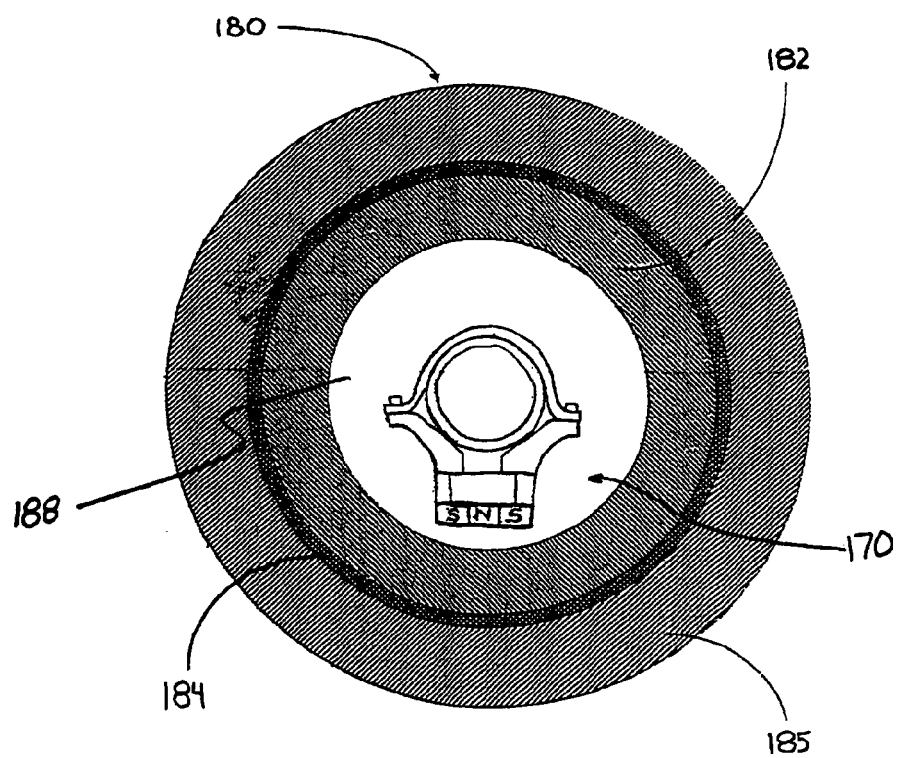
FIG. 4B is a cross-sectional illustration of the cylindrical sputtering target of FIG. 4A.

In the particular embodiment of FIG. 3, the motor assembly 30 comprises a motor source 76 (which is operable in conjunction with a power source 78 and a control system 80) that includes one or more pulleys 82 and one or more toothed belts 84. The pulleys 82 and belts 84 are operably connected to the electrode assembly 26 so that when the motor source 76 is activated it moves the electrode 28 in a rotational motion (i.e., it rotates the electrode 28 about its longitudinal axis 72).

In another particular embodiment (not shown), the electrode assembly 26 includes a shaft extending longitudinally from the electrode 28, supported on pivot bearings, and connected over a sliding contact with a voltage source. The shaft is connected to a drive motor, the speed of which can be controlled by a drive control. Many other systems can be used for rotatably mounting the electrode 28.

A single electrode assembly 26 is illustrated in the deposition chamber 12. However, two or more electrode assemblies 26 can be provided in a single chamber 12, if so desired. Embodiments of this nature are expected to be of particular advantage. Thus, certain embodiments of the invention provide a deposition chamber wherein there are provided at least two electrode assemblies 26 of the described nature.

In certain preferred embodiments, the deposition chamber 12 is provided with a divider between the substrate-coating region 14 and the electrode-cleaning region 16. This divider separates the coating 14 and cleaning 16 regions of the chamber 12, preferably such that different gaseous atmospheres can be maintained in these regions. Preferably, the coating 14 and cleaning 16 regions of the chamber 12 are each connected to a separate vacuum pump and a separate gas delivery line, and monitored separately for pressurization (i.e., for total and partial pressures), such that each region 14, 16 of the chamber 12 is an independently controlled environment.

The divider can be provided in a variety of different forms. For example, the divider can take the form of a single wall. One embodiment of this nature is shown in FIG. 1, wherein the illustrated single-wall divider comprises partitions (or "partial dividers") 18, 20 that isolate the respective atmospheres of the coating 14 and cleaning 16 regions. Each partition 18, 20 has an end 18E, 20E adjacent the electrode 28. The distance (or "gap") between the electrode 28 and the end 18E, 20E of each partition 18, 20 (or between the electrode and an isolation cup, etc., on the end of each partition) is preferably quite small (e.g., less than an inch). In some embodiments, this distance does not exceed (e.g., is smaller than) the dark-space distance that arises under existing process conditions. As is adequately defined in plasma physics, the dark-space distance is so small that neither chemical reaction nor plasma discharge can develop in this space. In some cases, the distance between the electrode 28 and the end 18E, 20E of each partition 18, 20 (or an isolation cup, etc.) is less than about 3 mm (e.g., between about 1 mm and about 3 mm). In other cases, this distance is somewhat greater (e.g., between about 1 mm and about 20 mm).

In the embodiment of FIG. 1, the divider includes optional isolation cups 22, 24. While these isolation cups 22, 24 are not required, they can be provided to enhance the separation of the first and second atmospheres. For example, they provide a circumferentially more extensive (i.e., extending further about the circumference of the electrode 28) dark space between the electrode 28 and the end 18E, 20E of each partition 18, 20, thus tending to reduce the likelihood of plasma discharge and chemical reaction occurring in this space.

The partial dividers 18, 20 can be formed of the same metallic material as the walls of chamber 12. The isolation cups 22, 24 can also be formed of metallic material. However, it may be preferable to form the isolation cups 22, 24 of an electrically nonconductive material so they do not become charged during operation. This may minimize plasma bombardment of the isolation cups 22, 24.

Figure 8:
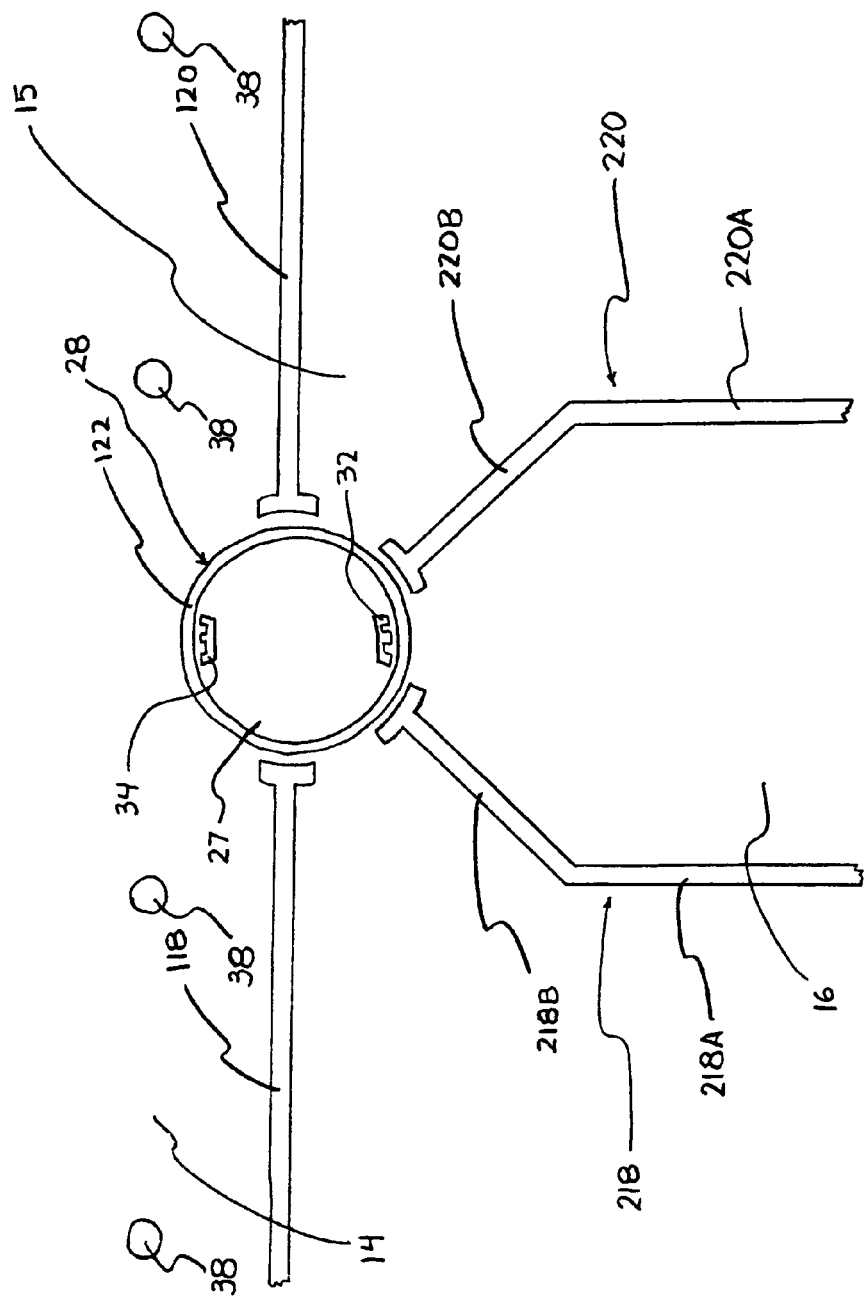
FIG. 8 is a cross-sectional side illustration of an apparatus for depositing films onto substrates in accordance with certain embodiments of the invention.

In certain embodiments, the divider comprises two spaced-apart walls bounding an intermediate atmosphere 15. In these embodiments, it will be appreciated that each wall may comprise two partitions. Further, there can be provided a vacuum pump (not shown) in communication with the intermediate atmosphere 15. FIG. 8 depicts one embodiment of this nature, wherein the divider includes two spaced-apart walls each comprising two partitions. The divider in this embodiment comprises a first wall defined by a first set of partitions 118, 120 and a second wall defined by a second set of partitions 218, 220. The first partitions 118, 120 extend in a generally planar manner (e.g., generally horizontally) from the chamber wall (not shown) toward the electrode 28. The second partitions 218, 220 have first lengths 218A, 220A that extend in a generally planar manner (e.g., generally vertically) away from the chamber wall (e.g., the floor), and second lengths 218A, 220A that extend convergingly toward the electrode 28. Thus, each second partition extends upwardly from the chamber floor and then turns inwardly at an angle toward the electrode 28.

In embodiments where the divider comprises spaced-apart walls, these walls can be provided in a variety of different configurations. For example, the spaced-apart walls can be generally parallel to each other (not shown), if so desired. As noted above, a vacuum pump may be in communication with the intermediate atmosphere 15. In some cases, the optional vacuum pump is adapted for differential pumping of the intermediate atmosphere 15. Thus, the intermediate atmosphere 15 can be pumped differentially to provide further isolation of the atmosphere in the coating region 14 from the atmosphere in the cleaning region 16 and vice versa.

While exemplary divider embodiments have been described and illustrated, the coating 14 and cleaning 16 regions can be separated in many different ways. For example, a soft padding or the like can be attached to the optional isolation cups 22, 24. Further, embodiments are anticipated wherein the gaseous atmospheres in the coating 14 and cleaning 16 regions are isolated without any physical barrier between these regions 14, 16 (e.g., by controlling gas flows in the chamber such that different atmospheres are maintained in the coating and cleaning regions of the chamber). Skilled artisans will appreciate that a variety of other means can be used for isolating the atmospheres of the coating 14 and cleaning 16 regions.

The chamber 12 is provided with a gas distribution system adapted for delivering gas 58 to both the substrate-coating region 14 and the electrode-cleaning region 16. Preferably, the gas distribution system is adapted for delivering a precursor gas (optionally together with some inert gas) to the coating region 14, and for delivering a sputtering gas (preferably an inert sputtering gas, such as argon or another noble gas) to the cleaning region 16. For example, the gas distribution system can comprise a supply of a desired precursor gas and a gas line 48 for delivering the precursor gas to the coating region 14. Conjointly, the gas distribution system can comprise a supply of a desired sputtering gas and a gas line 50 for delivering the sputtering gas to the cleaning region 16. In some cases, the gas distribution system is adapted for delivering a mix of precursor gas and inert gas to the coating region 14.

In the embodiment of FIG. 1, the gas distribution system includes gas-delivery ports 52 opening into the coating region 14 of the chamber 12 and gas-delivery ports 54 opening into the cleaning region 16 of the chamber 12. In this embodiment, a conduit or piping 48 extends from a gas supply (not shown) to the gas-delivery ports 52 opening into the coating region 14. Likewise, a conduit or piping 50 extends from a gas supply (not shown) to the gas-delivery ports 54 opening into the cleaning region 16. In this embodiment, conductors/anodes 56 are provided adjacent each set of gas-delivery ports 52, 54. These conductors/anodes 56 provide a charge in sufficient proximity to the delivery ports 52, 54 to maintain stable plasma. Thus, it can be appreciated that each region 14, 16 of the chamber 12 is preferably provided with at least one anode 56 at a location spaced away from the electrode 28. Accordingly, an electrical field is preferably created in each region 14, 16 of the chamber 12 between an anode 56 and the electrode 28.

In certain embodiments, the separate conductors/anodes 56 are omitted and a gas-delivery anode is provided. For example, the gas-delivery ports 52, 54 can themselves serve as anodes. Gas-delivery anodes are detailed in U.S. patent application Ser. No. 10/373,703, entitled "Magnetic Sputtering Systems Including Anodic Gas Distribution System", the entire contents of which are incorporated herein by reference. A variety of particularly advantageous gas-delivery systems and anodes are described in this '703 patent application and the present chamber 12 can be provided with any of these gas-delivery systems and anodes.

Thus, the deposition chamber 12 is preferably adapted for delivery of different gases to the coating 14 and cleaning 16 regions. Further, both regions 14, 16 of the chamber 12 are preferably provided with separate vacuum pumps (or separate sets of vacuum pumps). For example, a first vacuum pump can be operably connected to the coating region 14 and a second vacuum pump can be operably connected to the cleaning region 16. In the embodiment of FIG. 1, a first vacuum pump (not shown) is connected to the coating region 14 through a first vacuum line 44, and a second vacuum pump (not shown) is connected to the cleaning region 16 through a second vacuum line 46. By providing both regions 14, 16 of the chamber 12 with their own gas delivery and pumping, different controlled environments (e.g., different gaseous atmospheres) can be established and maintained in these 14, 16 regions.

It can be appreciated that the present system preferably includes at least one power supply 78. In certain aspects of the invention, a medium or low frequency power supply/generator is used. In one aspect, the power supply 78 provides the conductors/anodes 56 with a positive DC voltage of approximately 100 volts with a medium to low frequency signal of between about 3 KHz and about 100 KHz, and the electrode 28 receives from the power supply 78 a negative DC voltage of approximately 100 volts with a medium to low frequency signal of between about 3 KHz and about 100 KHz. The medium to low frequency is used to prevent plasma instability, which can occur when a negative electric field equilibrium builds-up on an electrically-nonconductive substrate 36 (e.g., glass). It is advantageous to use medium or low frequency generators, rather than standard high frequency generators, to discharge an electrically-nonconductive substrate 36. Medium and low frequency generators are easier to build, and easier to impedance match with plasma, than high frequency generators. Thus, the optional use of a medium or low frequency power supply is a particularly advantageous aspect of the present invention.

The deposition chamber 12 itself can have a variety of suitable configurations. Preferably, the chamber 12 includes walls (e.g., a floor 12F, ceiling 12C, and at least one sidewall 12S) bounding an interior volume (desirably having two isolated regions 14, 16) in which a controlled environment can be established (e.g., desirably in which two isolated, controlled environments can be established). The walls of the chamber 12 are preferably formed of rigid material (e.g., a metal or metal alloy, such as stainless steel). The walls are assembled to form a chamber that can accommodate a vacuum within the interior volume of the chamber. Thus, the chamber 12 is capable of being evacuated, such that a controlled, low pressure gaseous atmosphere can be established therein.

The deposition chamber 12 preferably includes an entrance 40 for providing substrate ingress and an exit 42 for providing substrate egress. The entrance 40 and/or the exit 42 can be a narrow slot-like opening that is slightly larger than a desired sheet-like substrate (e.g., a glass sheet). The entrance and exit of the chamber can be of any desired design suitable for vacuum deposition chambers. Various entrance and exit designs are well known in the present art, and any conventional design can be used.

A substrate support is preferably provided (e.g., located) in the substrate-coating region 14 of the chamber 12. Preferably, the substrate support defines a path of substrate travel a desired portion of which is adjacent the electrode 28. The first magnet system 34 is preferably adapted to create (e.g., in the gaseous atmosphere in the substrate-coating region 14) a first plasma confinement 60 about the desired portion of the path of substrate travel. Thus, when the precursor gas of the first gaseous atmosphere is chemically reacted and/or decomposed in the first plasma confinement 60, a substrate (in particular, a desired surface 62 area of a substrate) on the desired portion of the path of substrate travel is exposed to the chemically reacting and/or decomposing precursor gas and is thereby coated. It can be appreciated that the desired portion of the path of substrate travel is preferably adjacent (e.g., just above) the electrode 28. In certain preferred embodiments, the substrate 36 has a second major surface 64 opposite the first major surface 62 (which surface 62 is oriented away from the electrode 28 and is coated during exposure to the chemically reacting and/or decomposing gas in the first plasma confinement 60), and the second major surface remains substantially uncoated following exposure of the substrate to the first plasma confinement 60.

In the embodiments of FIGS. 1 and 8, the substrate support comprises a plurality of spaced-apart rollers 38. The rollers 38 are adapted for conveying substrates 36 through the substrate-coating region 14 of the chamber 12. The rollers 38 can be of any conventional structure. It may be preferable to employ cylindrical aluminum rollers about which a rope of Kevlar™ is spirally wound, with the Kevlar™ providing the surface with which the substrate 36 comes into direct contact.

In practicing the present invention, there is provided a film-deposition apparatus comprising: a deposition chamber 12 having a substrate-coating region 14 and an electrode-cleaning region 16; an electrode 28 positioned in the deposition chamber 12 and having an interior cavity 27; and first 34 and second 32 magnet systems disposed in the interior cavity 27 of the electrode 28. A first gaseous atmosphere comprising a precursor gas is preferably established in the substrate-coating region 14, and a second gaseous atmosphere comprising a sputtering gas is preferably established in the electrode-cleaning region 16. In some embodiments, a cathodic charge is delivered to the electrode 28 (e.g., while an anodic charge is delivered to, or otherwise exists on, the electrode 56), thereby creating in the first gaseous atmosphere plasma that is held by the first magnet system 34 in a first plasma confinement 60 and creating in the second gaseous atmosphere plasma that is held by the second magnet system 32 in a second plasma confinement 66. The precursor gas in the substrate-coating region 14 is chemically reacted and/or decomposed by the action of plasma in the second plasma confinement 66. A substrate 36 is positioned in the substrate-coating region 14 and is exposed (e.g., surface 62 is exposed) to the chemically-reacting and/or decomposing precursor gas such that coating is formed on the substrate 36 (e.g., in some cases, only on surface 62). The substrate 36 can be thus exposed by conveying the substrate 36 along a substrate support that defines a path of substrate travel (which desirably extends/passes through confinement 60) a desired portion of which is adjacent the electrode 28 and in the first plasma confinement 60. For example, the upper surface 62 of the substrate 36 can be exposed to the first plasma confinement 60, such that coating condenses upon this surface 62 of the substrate 36 (but not on surface 64, in some embodiments). During this substrate-coating process, the electrode 28 can be rotated such that unwanted contamination (e.g., coating) is cleaned from the electrode 28. If desired, the electrode 28 can be rotated continuously (e.g., in a constant clockwise or counterclockwise direction) during operation such that contamination is cleaned continuously from the electrode 28. As noted above, the electrode 28 can be cylindrical, and thus can be rotated in any desired manner (e.g., oscillated back and forth) to remove contamination from a desired circumferential extent of the electrode 28 during any given electrode cleaning period or operation.

In operation, a substrate (e.g., a sheet-like substrate 36 having generally-opposed upper 62 and lower 64 major surfaces) can be conveyed into the chamber 12 on the rollers 38. For example, the substrate 36 can be positioned on the rollers 38 (e.g., at a loading portion of the path of substrate travel, which is typically outside the chamber 12) and the rollers 38 can then be powered-up and thus rotated to advance the substrate 36 through the chamber entrance 40 and into the chamber 12. The rollers 38 are typically operated at a constant speed during film deposition, although this is by no means required. Exemplary substrate speeds range between about 100 inches per minute and about 500 inches per minute. If so desired, the substrate 36 can be translated back and forth (i.e., moved repeatedly forward and backward) on the rollers 38 during film deposition. In most cases, though, it is preferable to convey the substrate 36 through the chamber 12 at a constant speed during film deposition, such that the substrate 36 is coated in a single pass through the chamber 12. Once the substrate 36 has been coated, it is conveyed through the chamber exit 42 and out of the chamber 12.

Before the chamber 12 is used for film deposition, preconditioning is preferably performed. This preconditioning may entail pumping down the coating 14 and cleaning 16 regions of the chamber 12 with vacuum pumps (not shown) to remove moisture and contaminants. Following this preconditioning, gas 58 is pumped into the chamber 12 via the gas distribution system. For example, gas 58 can be delivered (e.g., injected or bled into) to the coating chamber 14 through a first set of nozzles 52 and into the cleaning chamber 16 through a second set of nozzles 54. In particular, precursor gas is delivered to the coating region 14, and sputtering gas is delivered to the cleaning region 16. If so desired, sputtering gas can be delivered to the coating region 14 in a first step to establish plasma in the first confinement 60, and the precursor gas can be delivered to the coating region 14 in a subsequent step when it is desired to begin film deposition. During operation, a desired total pressure is maintained in the coating region 14 by appropriate gas delivery and pumping of this region 14. Likewise, a desired total pressure is maintained in the cleaning region 16 by appropriate gas delivery and pumping of this region 16. The total pressure maintained in the coating region 14 may vary about 0.022 mbar, while the total pressure maintained in the cleaning region 16 may range between about 1 Pa and about 15 Pa. Of course, these are merely exemplary ranges and the total pressures for various processes can be varied as desired. An electrical field is established in each region 14, 16 of the chamber 12 between the electrode 28 and the anode or anodes 56. The electrical fields are established by operating the power supply 78 to deliver a cathodic charge to the electrode 28 and an anodic charge to the anode(s) 56. The power supply 78 can be operated to provide the anodes 56 with a positive DC voltage of approximately 100 volts with a medium to low frequency signal of between about 3 KHz and about 100 KHz, while the electrode 28 receives from the power supply 78 a negative DC voltage of approximately 100 volts with a medium to low frequency signal of between about 3 KHz and about 100 KHz. The electrical field in each region 14, 16 converts gas therein to plasma. The plasma in the coating region 14 is localized in the first plasma confinement 60 by the magnetic flux lines 61 created by the first magnet system 34. Likewise, the plasma in the cleaning region 16 is localized in the second confinement 66 by the magnetic flux lines 61 created by the second magnet system 34.

The substrate 36 is conveyed through the coating region 14 of the chamber 12. In some embodiments, when the substrate 36 reaches the desired portion of the path of substrate travel, the upper surface 62 of the substrate is exposed to the first plasma confinement 60 and thus to the chemically reacting and/or decomposing precursor gas therein. As a result, coating condenses upon this surface 62 of the substrate 36.

As noted above, gaps 41 are maintained between adjacent substrates 36 in some cases (e.g., when spaced-apart substrates are coated). Thus, the electrode 28 will at times (e.g., when the gaps 41 are aligned with the electrode 28) be exposed to the chemically-reacting and/or decomposing precursor gas in the first plasma confinement 60. Thus, coating may also condense upon the electrode 28. In the cleaning region 16, there is no substrate between the electrode 28 and the plasma. Rather, the electrode 28 is exposed to this plasma. Therefore, in some embodiments, positively-charged particles in this plasma are attracted to the electrode and bombard its outer surface 123, thus sputtering away coating from the outer surface 123 of the electrode 28. The electrode 28 can be rotated continuously during film deposition. In an alternate aspect, the cleaning process is only performed until the coating is removed from the electrode 28 to a desired extent, whereafter the cleaning process is stopped. For example, the cleaning process can be continued for a predetermined period of time, which assures that coating will removed from electrode 28 to a desired extent. As noted above, a further aspect involves adjusting the magnetic fields in the coating 14 and cleaning 16 regions of the chamber 12 such that the substrate-coating rate is satisfactory while the electrode-cleaning rate is sufficient to remove unwanted coating from the outer surface 123 of the electrode 28 without undue sputtering away of the electrode itself.

In one exemplary method, methyl methacrylate ($C_5H_8O_2$) is provided in the substrate-coating region 14 of the deposition chamber 12, along with 5 volume percent argon. The methyl methacrylate and argon are delivered to the substrate-coating region 14, for example, through a metering valve at 60 cc/sec, and a process pressure of $2.2 \times 10^{-2}$ mbar is maintained by appropriate pumping of the substrate-coating region 14. The electrode-cleaning region 16 is provided with 100% argon. The argon is delivered to the electrode-cleaning region 16, for example, through a metering valve and a process pressure is maintained by appropriate pumping of the electrode-cleaning region 16. The anodes 56 are provided with a positive DC voltage with a medium to low frequency signal of between about 3 KHz and about 100 KHz, while the electrode 28 is provided with a negative DC voltage with a medium to low frequency signal of between about 3 KHz and about 100 KHz. The total area of the electrode's outer surface 123 is about 450 cm². The electrode 28 is rotated continuously during film deposition. The substrate 36 is conveyed through the chamber 12 and the upper surface 62 of the substrate 36 is thus coated with plasma-polymerized methyl methacrylate film.

Preferably, the electrode 28 projects into both the substrate-coating region 14 of the chamber 12 and the electrode-cleaning region 16 of the chamber. Thus, during rotation of the electrode 28 (e.g., continuously in the same direction, such as clockwise or counter-clockwise), a given point on the outer surface 123 of the electrode 28 preferably passes through the substrate-coating region 14, thereafter through the electrode-cleaning region 16, thereafter through the substrate-coating region 14 again, thereafter through the electrode-cleaning region 16 again, and so on. Preferably, gas passage between the substrate-coating region 14 and the electrode-cleaning region 16 is prevented or substantially prevented. In certain embodiments, a substrate during coating is positioned a desired distance from the electrode (e.g., less than about six inches, perhaps more preferably less than about four inches, and perhaps more preferably less than about two inches (e.g., about an inch or less).

While preferred embodiments of the invention have been described, it should be understood that numerous changes, adaptations, and modifications can be made without departing from the spirit of the invention and the scope of the appended claims.

What is claimed is:

1. A method for depositing films onto substrates, the method comprising:
  a) providing a film-deposition apparatus comprising a single deposition chamber having a substrate-coating region and an electrode-cleaning region, a rotatable electrode positioned in the deposition chamber and having an interior cavity, and a first and a second, distinct magnet systems disposed in said interior cavity wherein the first magnet system is oriented towards the substrate-coating region and the second magnet system is oriented towards the electrode-cleaning region;
  b) establishing in the substrate-coating region a first gaseous atmosphere comprising a precursor gas;
  c) establishing in the electrode-cleaning region a second gaseous atmosphere comprising a sputtering gas;
  d) delivering a charge to the electrode, thereby creating in the first gaseous atmosphere plasma that is held by the first magnet system in a first plasma confinement and creating in the second gaseous atmosphere plasma that is held by the second magnet system in a second plasma confinement, the precursor gas being chemically reacted and/or decomposed in the first plasma confinement; and
  e) positioning a substrate in the substrate-coating region and exposing the substrate to the chemically-reacting and/or decomposing precursor gas in the first plasma confinement such that coating is formed on the substrate.

2. The method of claim 1 wherein the substrate positioned in the substrate-coating region has a first major surface oriented away from the rotatable electrode, and wherein said coating is formed on the first major surface of the substrate.

3. The method of claim 2 wherein the substrate has a second major surface oriented toward the rotatable electrode, and the second major surface remains substantially uncoated during said exposure of the substrate in the first plasma confinement.

4. The method of claim 1 comprising conveying a series of spaced-apart substrates through the substrate-coating region and exposing the substrates to the chemically-reacting and/or decomposing precursor gas such that coatings are formed on the substrates.

5. The method of claim 1 wherein the electrode is exposed to the second gaseous atmosphere such that plasma in the second plasma confinement bombards an outer surface of the electrode, thereby cleaning unwanted contamination from the outer surface of the electrode.

6. The method of claim 5 wherein the electrode is rotated continuously during film deposition, and wherein unwanted contamination is cleaned continuously from the outer surface of the electrode.

7. The method of claim 1 wherein the electrode is cylindrical and is rotated about its longitudinal axis.

8. The method of claim 1 wherein the substrate is positioned in the substrate-coating region and exposed to the chemically-reacting and/or decomposing precursor gas by conveying the substrate along a substrate support that defines a path of substrate travel a desired portion of which is adjacent the electrode and is in the first plasma confinement.

9. The method of claim 8 wherein the substrate is a glass sheet, the substrate support comprises a series of spaced-apart transport rollers, and the glass sheet is conveyed over the rollers.

* * * * *